United States Patent
Chen et al.

(10) Patent No.: US 8,355,002 B2
(45) Date of Patent: Jan. 15, 2013

(54) BIAXIAL ROTARY DISPLAY MODULE

(75) Inventors: Chao-Jung Chen, Taipei (TW);
  Chien-Jen Chen, Yunlin County (TW);
  Po-Chen Liu, Taipei County (TW)

(73) Assignee: Quanta Computer Inc., Taoyuan Shien (TW)

( * ) Notice: Subject to any disclaimer, the term of this patent is extended or adjusted under 35 U.S.C. 154(b) by 284 days.

(21) Appl. No.: 12/801,797

(22) Filed: Jun. 25, 2010

(65) Prior Publication Data

US 2011/0193772 A1  Aug. 11, 2011

(30) Foreign Application Priority Data

Feb. 5, 2010 (TW) ................................ 99202443 U

(51) Int. Cl.
  *G09G 5/00* (2006.01)
(52) U.S. Cl. .................... 345/169; 361/679.27
(58) Field of Classification Search .................. 345/156, 345/169; 312/326, 319.2; 361/752, 679.21, 361/679.27; 16/343, 377
  See application file for complete search history.

(56) References Cited

U.S. PATENT DOCUMENTS

| | | | |
|---|---|---|---|
| 6,742,221 B2 * | 6/2004 | Lu et al. | 16/367 |
| 7,907,981 B2 * | 3/2011 | Baek | 455/575.4 |
| 2005/0207104 A1 * | 9/2005 | Love | 361/683 |
| 2008/0078060 A1 * | 4/2008 | Chen | 16/367 |

* cited by examiner

*Primary Examiner* — Chanh Nguyen
*Assistant Examiner* — Tsegaye Seyoum
(74) *Attorney, Agent, or Firm* — Rabin & Berdo, P.C.

(57) ABSTRACT

A biaxial rotary display module is disclosed, which includes a first casing, a rail disposed on the first casing, a rotary piece arranged in the rail, a second casing having s display panel, and two hinges. The rotary piece has a pivoting portion pivoted to the first casing, and the rotary piece is rotated in the rail. The hinges are disposed on opposite sides of the pivoting portion for connecting the second casing and the rotary piece, thereby causing the second casing able to be pivoted relative to the first casing via the two hinges and swiveled relative to the first casing via the rotary piece.

7 Claims, 3 Drawing Sheets

BIAXIAL ROTARY DISPLAY MODULE

RELATED APPLICATIONS

This application claims priority to Taiwan Application Serial Number 99202443, filed Feb. 5, 2010, which is herein incorporated by reference.

BACKGROUND

1. Field of Invention

The present invention relates to a display module. More particularly, the present invention relates to a rotary display module.

2. Description of Related Art

Liquid crystal displays have many advantages including high definition resolutions, small volumes, light, low voltage drive, low power consumption, a broad range of applications, etc. Therefore, liquid crystal displays are already broadly used in consumer electronic devices or computer products, such as portable televisions, cellular phones, camcorders, laptop computers, desktop displays, projection televisions, etc., thereby becoming the main stream for displays.

The liquid crystal display may be integrated with the operating interface as an operating display module and be utilized in the large machine to show the operation state of the large machine. However, the operating display module might be assembled on the top or the bottom of the rack of the large machine for some designing consideration, and that is not convenient for users to operate or see the operating display module.

SUMMARY

The invention provides a biaxial rotary display module, which includes a first casing, a rail disposed on the first casing, a rotary piece arranged in the rail, a second casing having a display panel, and two hinges. The rotary piece has a pivoting portion pivoted to the first casing, and the rotary piece is rotated in the rail. The hinges are disposed on opposite sides of the pivoting portion for connecting the second casing and the rotary piece, thereby causing the second casing able to be pivoted relative to the first casing via the two hinges and swiveled relative to the first casing via the rotary piece.

The first casing includes an upper cover and a bottom cover coupled to the upper cover; the rail is formed on the bottom cover; and the upper cover comprises two openings corresponding to the hinges respectively to restrict the rotary angle of the second casing. The biaxial rotary display module further includes an elastic piece disposed on the rotary piece that touches the upper cover or the lower cover. The biaxial rotary display module further includes a printed circuit board disposed in the first casing. The biaxial rotary display module further optionally includes two slide rails disposed on opposite sides of the first casing for being slidly installed in a rack. The shape of the rail can be a semicircle, and the rotary piece has a curve edge. Each of the hinges has a first hinge portion disposed on the second casing, and a second hinge portion disposed on the rotary piece. The rail can be a cavity. The biaxial rotary display module further includes an operating interface disposed on the second casing.

The biaxial rotary display module of the present invention discloses the biaxial rotary structure including the hinges and the rotary piece, which can be utilized in the thin thickness (about 6 mm) display module and provide biaxial rotary function.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
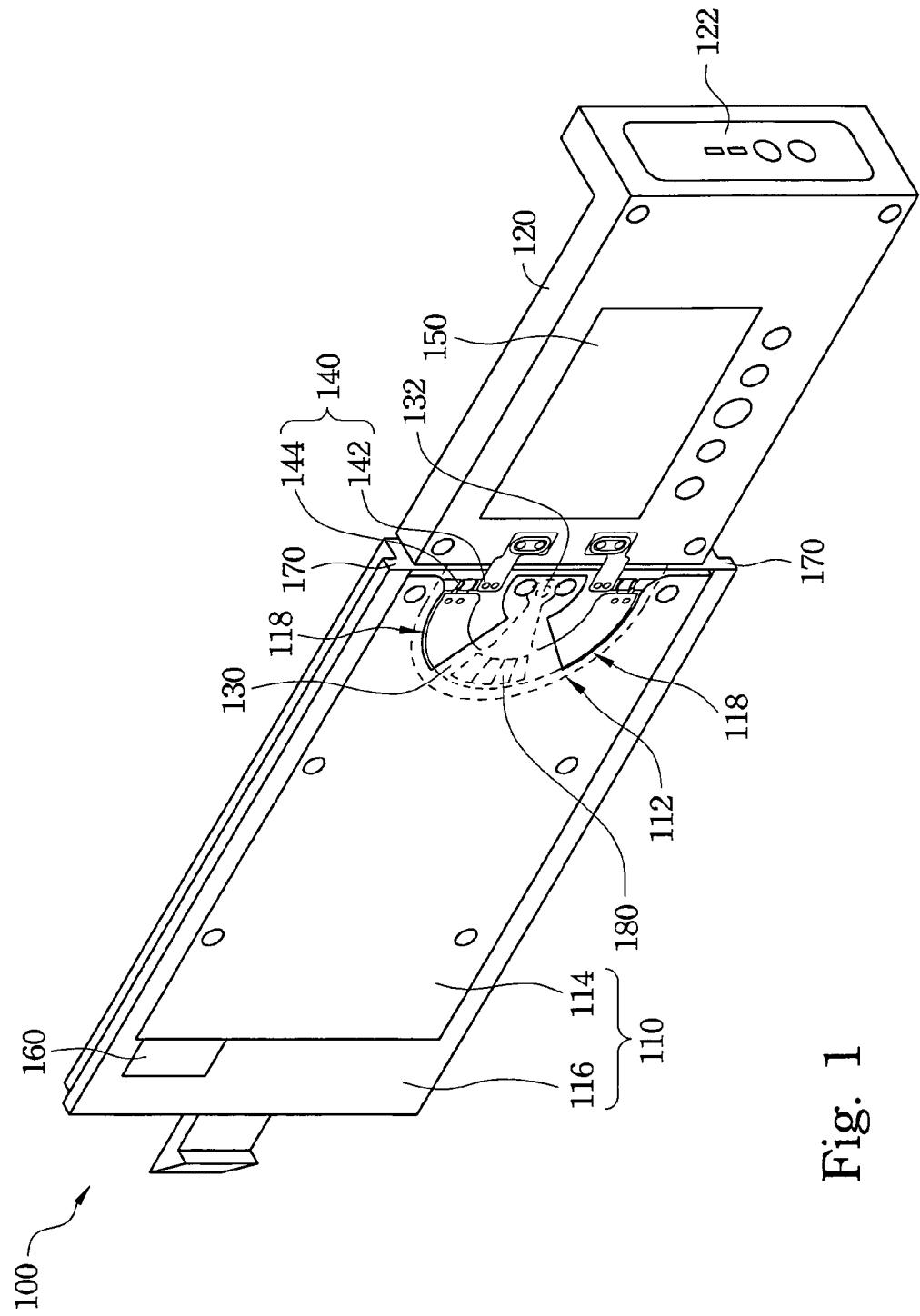
FIG. 1 is a schematic diagram of an embodiment of the biaxial rotary display module of the invention.

Reference will now be made in detail to the present embodiments of the invention, examples of which are illustrated in the accompanying drawings. Wherever possible, the same reference numbers are used in the drawings and the description to refer to the same or like parts.

Refer to FIG. 1. FIG. 1 is a schematic diagram of an embodiment of the biaxial rotary display module of the invention. The biaxial rotary display module 100 includes a first casing 110, a second casing 120, and a biaxial rotary structure for connecting the first casing 110 to the second casing 120. The biaxial rotary structure includes a rail 112 disposed on the first casing 110, a rotary piece 130, and two hinges 140. The rotary piece 130 has a pivoting portion 132 pivoted to the rail 112, thus the pivoting portion 132 can be regarded as a rotary center when the rotary piece 130 is rotated in the rail 112.

The hinges 140 are disposed on opposite sides of the pivoting portion 132. Each hinge 140 includes a first hinge portion 142 disposed on the second casing 120, and a second hinge portion 144 disposed on the rotary piece 130. The first hinge portion 142 and the second hinge portion 144 are assembled together, thus the hinges can connect the rotary piece 130 to the second casing 120. In this embodiment, the first hinge portions 142 are disposed on the second casing individually, and the second hinge portions 144 are disposed on the rotary piece 130 individually. The material of the hinges 140 can be metal. In other embodiment, the first hinge portions 142 disposed on the second casing 120 can connect to each other.

The rail 112 is disposed on the first casing 110 and is arranged at the side close to the second casing 120. The shape of the rail 112 can be a semicircle, and the rotary piece 130 rotated therein can have a curve edge. The shape of the rail 112 is designed to enable the hinges 140 rotating therein without interference, but not be limited to the semicircle. The shape of the rotary piece 130 and the rail 112 are designed according to the path for rotating the rotary piece 130 in the rail 112. The shape of the rotary piece 130 may be similar to the shape of the rail 112. However, the shape of the rotary piece 130 is not necessary to match the shape of the rail 112.

The pivoting portion 132 of the rotary piece 130 is pivoted on the rail 112 of the first casing 110. The hinges 140 disposed on opposite sides of the pivoting portion 132 are connected to the second casing 120 and the rotary piece 130 respectively, thus the second casing 120 would also be rotated when the pivoting piece 130 is rotated in the rail 112. Namely the pivoting portion 132 can be regarded as the rotary center when the second casing 120 and the rotary piece 130 are swiveled relative to the first casing 110 (see FIG. 2B).

Figure 2A:
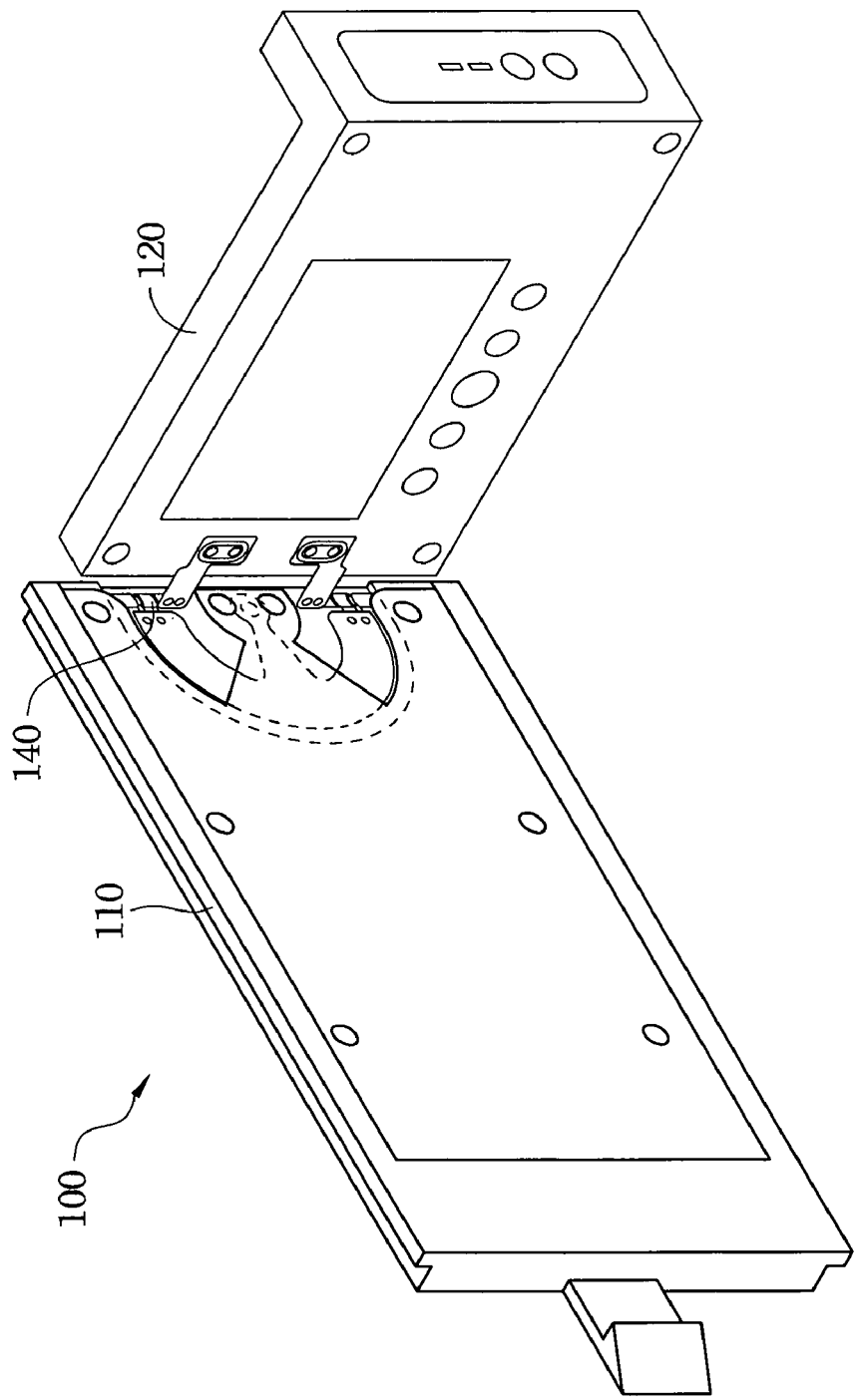
FIG. 2A and FIG. 2B are schematic diagrams of different operation states of the biaxial rotary display module of FIG. 1.

Besides, due to the hinges 140 connect the rotary piece 130 and the second casing 120, the hinges 140 can be regarded as another rotary center when the second casing 120 is rotated relative to the first casing 110 (see FIG. 2A).

The biaxial rotary display module 100 can be equipped with a display panel 150 and an operating interface 122 to be utilized in a large rack, such as a server system rack, to show the operation state of the server system. The display panel 150 and the operating interface 122 both can be disposed on the second casing 120. The biaxial rotary display module 100 further includes a printed circuit board 160, which is electrically connected to the display panel 150 and the operating interface 122, disposed in the first casing 110. The printed circuit board 160 further electrically connects to the electronic devices of the server system, thus the operation state of the electronic devices can be shown on the display panel 150, and the electronic devices can be operated by the operating interface 122. The display panel 150 can be a touch panel, thus the operating interface 122 can be integrated to the display panel 150.

The first casing 110 has an upper cover 114 and a bottom cover 116 coupled to the upper cover 114. The rail 112 is a cavity formed on the surface of the bottom cover 116 facing the upper cover 114. The upper cover 114 may optionally have two openings 118 corresponding to the hinges 140 respectively and each opening 118 exposes a portion of the rail 112. The hinges 140 are rotated in the openings 118 respectively when the rotary piece 130 is rotated in the rail 112. Thus the rotary angle of the rotary piece 130, the hinges 140, and the second casing 120 can be restricted by the openings 118.

The biaxial rotary display module 100 may optionally include two slide rails 170 disposed on the first casing 110. The slide rails 170 are disposed on opposite sides of first casing 110, and the large rack has tracks disposed corresponding to the slide rails 170 to install the biaxial rotary display module 100 and cause the first casing 110 able to be slid in the large rack by the slide rails 170. The biaxial rotary display module 100 can be pulled out from the large rack when users want to see the operation state shown on the display panel 150. Then the second casing 120 can be rotated relative to the first casing 110 to a preferred angle by rotating the rotary piece 130 in the rail 112. The width of the second casing 120 is smaller than the distance between two slide rails 170.

The biaxial rotary display module 100 may further include an elastic piece 180 to provide a friction force to position the rotary piece 130 in the rail 112 and increase the operation feeling when the rotary piece 130 is rotated in the rail 112. The elastic piece 180 can be disposed in the rotary piece 130 and touches the upper cover 114 or the bottom cover 116.

Figure 2B:
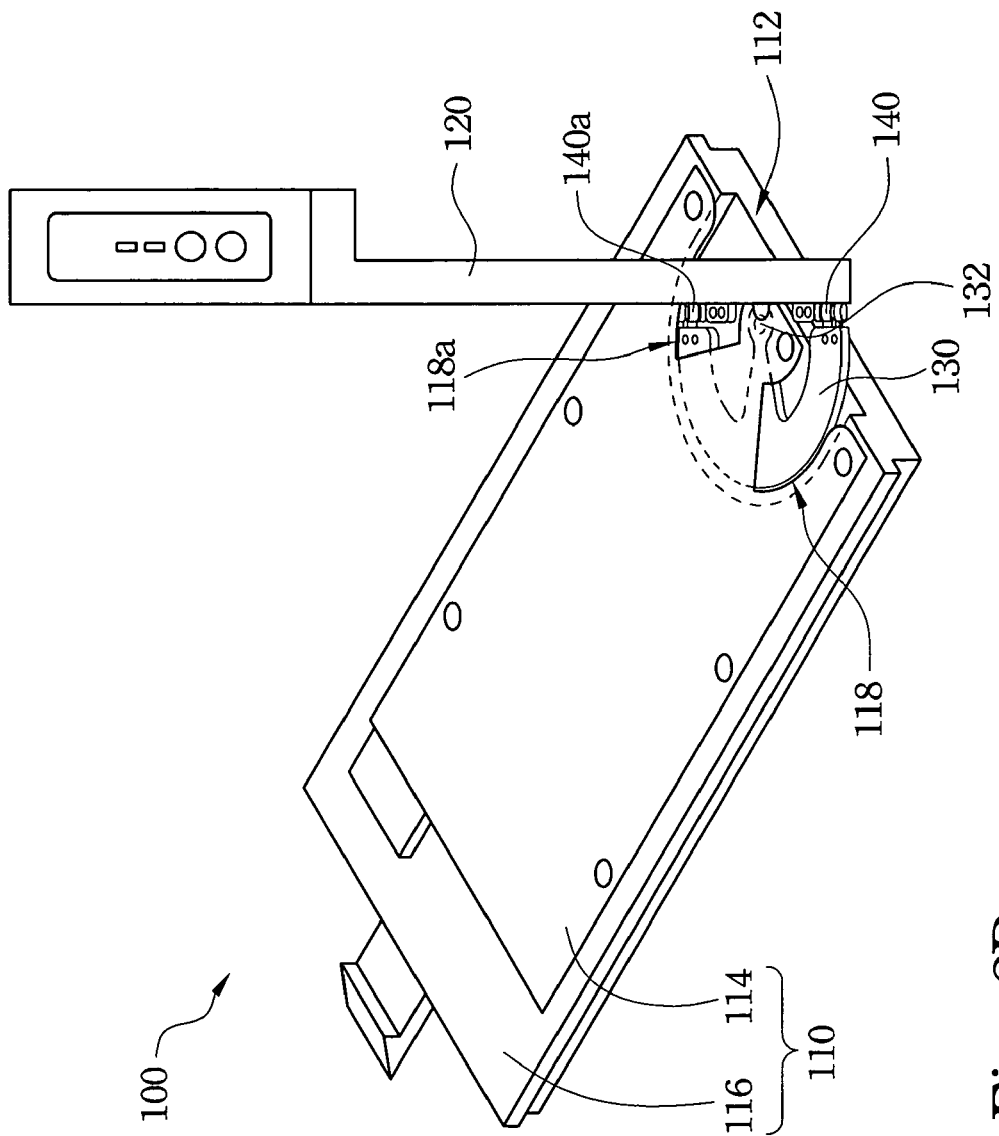

Refer to FIG. 2A and FIG. 2B. FIG. 2A and FIG. 2B are schematic diagrams of different operation states of the biaxial rotary display module of FIG. 1. In FIG. 1, the first casing 110 and the second casing 120 are completely open. In FIG. 2A, the second casing 120 of the biaxial rotary display module 100 is rotated relative the first casing 110 via the hinges 140 (i.e. the second casing 120 can be regarded being lifted and standing relative to the first casing 110).

In FIG. 2B, the second casing 120 is swiveled relative to the first casing 110 via the pivoting portion 132. The hinges 140 for connecting the rotary piece 130 and the second casing 120 are rotated in the openings 118. The openings 118 restrict the rotary angle of the hinges 140. In details, when the hinge 140a touches the edge of the opening 118a, the edge of the opening 118a would stop the hinge 140a, and the rotary angle of the hinge 140a and the second casing 120 connected to the hinges 140 can be restricted. Restricting the rotary angle of the second casing 120 can protect the wire inner the biaxial rotary display module 100 and prevent the wire being damaged caused by over rotary of the second casing 120.

The biaxial rotary display module of the present invention discloses the biaxial rotary structure including the hinges and the rotary piece, which can be utilized in the thin thickness (about 6 mm) display module and provide biaxial rotary function.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A biaxial rotary display module comprising:
    a first casing comprising an upper cover and a bottom cover coupled to the upper cover, the upper cover having two openings facing away from the bottom cover;
    two slide rails disposed on opposite sides of the first casing being slidably installed in a rack;
    a rail disposed on the first casing the rail being a cavity formed on the bottom cover;
    a rotary piece arranged in the rail, the rotary piece including a pivoting portion pivoted to the first casing, the rotary piece being rotated in the rail;
    a second casing having a display panel; and
    two hinges disposed on opposite sides of the pivoting portion for connecting the second casing and the rotary piece, thereby allowing the second casing to be pivoted relative to the first casing via the two hinges and swiveled relative to the first casing via the rotary piece, the hinges being moved along the openings when the second casing is swiveled relative to the first casing and a rotary angle of the second cash being restricted by the openings.

2. The biaxial rotary display module of claim 1, further comprising an elastic piece disposed on the rotary piece and touching the upper cover or the lower cover.

3. The biaxial rotary display module of claim 1, further comprising a printed circuit board disposed in the first casing.

4. The biaxial rotary display module of claim 1, wherein a shape of the rail is a semicircle.

5. The biaxial rotary display module of claim 4, wherein the rotary piece has a curve edge.

6. The biaxial rotary display module of claim 1, wherein each hinge has a first hinge portion disposed on the second casing, and a second hinge portion disposed on the rotary piece.

7. The biaxial rotary display module of claim 1, further comprising an operating interface disposed on the second casing.

* * * * *